United States Patent
Schroeder et al.

(10) Patent No.: US 10,318,677 B2
(45) Date of Patent: Jun. 11, 2019

(54) SYNTHESIS OF RADIO FREQUENCY ENVIRONMENT

(71) Applicant: Textron Innovations, Inc., Providence, RI (US)

(72) Inventors: Brian Noel Schroeder, Clearwater, KS (US); Michael James Salt, Arlington Heights, IL (US); Brett Lee Lusby, Wichita, KS (US)

(73) Assignee: Textron Innovations, Inc., Providence, RI (US)

( * ) Notice: Subject to any disclaimer, the term of this patent is extended or adjusted under 35 U.S.C. 154(b) by 754 days.

(21) Appl. No.: 14/215,561

(22) Filed: Mar. 17, 2014

(65) Prior Publication Data
US 2015/0261895 A1    Sep. 17, 2015

(51) Int. Cl.
*G06F 17/50* (2006.01)
*H04B 17/391* (2015.01)

(52) U.S. Cl.
CPC ...... *G06F 17/5036* (2013.01); *G06F 17/5063* (2013.01); *H04B 17/3912* (2015.01)

(58) Field of Classification Search
CPC ............. H04B 17/3912; G06F 17/5063; G06F 17/5036
USPC .......................................................... 703/2
See application file for complete search history.

(56) References Cited

U.S. PATENT DOCUMENTS

| | | | | |
|---|---|---|---|---|
| 3,358,284 A | * | 12/1967 | Millar | G01S 1/026 327/231 |
| 3,413,638 A | * | 11/1968 | Trim | G01S 1/026 327/163 |
| 3,845,484 A | * | 10/1974 | Sawicki | G01S 1/026 342/169 |
| 3,982,244 A | * | 9/1976 | Ward | G01S 7/4021 342/149 |
| 4,019,183 A | * | 4/1977 | Haynes | G01S 1/028 342/391 |
| 4,311,466 A | * | 1/1982 | Carpenter | G01S 1/028 434/242 |
| 4,543,066 A | * | 9/1985 | French | G09B 9/00 375/224 |
| 5,134,412 A | | 7/1992 | Baseghi et al. | |
| 5,790,438 A | * | 8/1998 | Simonnet | G01R 31/2834 342/165 |

(Continued)

FOREIGN PATENT DOCUMENTS

| | | | | |
|---|---|---|---|---|
| EP | 0052671 B1 | 4/1986 | | |
| EP | 0537888 A1 | 8/1992 | | |
| EP | 1647832 A1 | * | 4/2006 | G01S 19/11 |

OTHER PUBLICATIONS

Spirent Communications plc., Spirent Gss7790 Multi-output GPS Simulation System, Feb. 2012, Spirent Communications plc. MCD00151 Issue 1-02 Feb. 2012.*

*Primary Examiner* — Rehana Perveen
*Assistant Examiner* — Justin C Mikowski
(74) *Attorney, Agent, or Firm* — Erise IP, P.A.

(57) ABSTRACT

A system and method for simulating the radio frequency environment of an aircraft is described. Simulated location data and navigational aid data is used to calculate a digital representation of the radio frequency environment of an airplane at the simulated location. The digital representation of the radio frequency environment is converted into an analog signal and provided to the navigational system of the aircraft.

18 Claims, 2 Drawing Sheets

(56) References Cited

U.S. PATENT DOCUMENTS

| | | | | |
|---|---|---|---|---|
| 6,205,400 B1* | 3/2001 | Lin | ............... | G01C 21/165 342/357.31 |
| 6,427,122 B1* | 7/2002 | Lin | ............... | G01C 21/165 342/26 B |
| 7,489,274 B2* | 2/2009 | Doyle | ............... | G01S 1/024 342/402 |
| 7,573,389 B2 | 8/2009 | Kiyohara | | |
| 7,778,744 B2 | 8/2010 | Rath et al. | | |
| 7,898,467 B2* | 3/2011 | Rambach | ............... | G01S 1/02 342/169 |
| 8,352,238 B2* | 1/2013 | Casse | ............... | G01S 1/028 342/357.2 |
| 2008/0261638 A1* | 10/2008 | Wahab | ............... | H03M 1/0639 455/500 |
| 2010/0305932 A1* | 12/2010 | Casse | ............... | G01S 1/028 703/13 |
| 2011/0286505 A1* | 11/2011 | Hedley | ............... | G01S 5/0205 375/224 |

\* cited by examiner

SYNTHESIS OF RADIO FREQUENCY ENVIRONMENT

BACKGROUND

Field of the Invention

The system and method disclosed herein are in the field of aircraft navigation systems. More specifically, they are in the field of simulation equipment for aircraft, namely the dynamic simulation of the radio frequency environment of an aircraft created by navigational aids.

Description of the Related Art

Various methods have been utilized for simulating the location of an aircraft for the purpose of operating the navigational systems of an aircraft in a simulation scenario. Typically such simulation scenarios require the simulation system to be connected to the navigational systems through non-standard connections that directly feed a simulated navigational position to the navigational systems. The navigational systems then process, display or otherwise provide that navigational data to the pilot or other systems of the aircraft. The functions of the navigational system to receive and process actual radio frequency signals, as they will be expected to do in actual use, are bypassed by this procedure and are not utilized in the simulation environment.

SUMMARY OF THE INVENTION

In embodiments, the invention includes a method for simulating the radio frequency environment of an aircraft having a navigational system capable of receiving radio frequency signals. A simulated location for an aircraft is provided and navigational aid data descriptive of navigational aids used by aircraft is selected based on that simulated location. A digital representation of a simulated radio frequency signal is calculated using the navigational aid data and the simulated location. The digital representation of a simulated radio frequency signal is converted to an analog radio frequency signal such as that typically received by an aircraft through an antenna. The analog radio frequency signal is provided to the navigational system of an aircraft, which processes the signal as though it were received from an antenna. In some embodiments, the simulated location for an aircraft includes simulated location data for an aircraft for each of the at least one navigational aid.

In some embodiments of the method, calculating the digital representation of the simulated radio frequency signal includes calculating a digital representation of a simulated radio frequency signal for each of the navigational aids based on the simulated location data and the navigational aid data. The digital representations for each of the navigation aids are combined to create the digital representations of the entire simulated radio frequency signal.

In other embodiments of the method, the process of converting the digital representation of a simulated radio frequency signal utilizes a digital-to-analog converter. The digital representation of the simulated radio frequency is provided to an input channel of the digital-to-analog converter, which converts the digital representation to an analog signal that is received from an output channel of the digital-to-analog converter.

In further embodiments of the method, the process of providing the analog radio frequency signal to the navigational system of the aircraft involves connecting, the output channel of the digital-to-analog converter to an antenna input of the receiver in the navigational system of the aircraft. The analog radio frequency signal is transmitted from the output channel to the antenna input of at least one receiver.

In additional embodiments of the method, the digital representation of the simulated radio frequency signal is generated continuously and simultaneously converted to an analog radio frequency signal and provided to the navigational system.

In still further embodiments of the method it includes receiving an updated simulated location for the aircraft, and utilizing the updated simulated location to calculate the digital representation of a simulated radio frequency signal.

In embodiments the system for simulating the radio frequency environment of an aircraft having a navigational system capable of receiving radio frequency signals via an antenna input includes a simulated location for an aircraft, navigational aid data descriptive of navigational aids, software executable on a general purpose computer that is capable of receiving the simulated location, accessing the navigational aid data, and calculating a digital representation of a simulated radio frequency signal from the navigational aid data and the simulated location, a digital-to-analog converter for receiving and converting the digital representation to an analog radio frequency signal, and a connection between the output channel of the digital-to-analog converter and an antenna input of an aircraft.

In some embodiments, the simulated location comprises simulated location data for an aircraft for each of the at least one navigational aid. In other embodiments, the software continuously calculates a digital representation of a simulated radio frequency signal. The digital-to-analog converter may continuously receive and convert the digital representation of a simulated radio frequency signal to an analog radio frequency signal during operation of the system.

The software is, in embodiments, capable of receiving an updated simulated location and modifying the digital representation and the analog radio frequency signal based on the updated simulated location.

Embodiments of the disclosed method of using the system to test the navigational system of an aircraft, the navigational system having at least one receiver for receiving radio frequency navigational signals, include the steps of providing a test system for simulating the location of an aircraft and receiving from the test system a simulated location of an aircraft. Navigational aid data is retrieved and a digital representation of a radio frequency signal is calculated based on the simulated location of an aircraft and the retrieved data. The digital representation is converted into an analog radio frequency signal which is transmitted to the receiver in the aircraft. The test is completed by comparing the location produced by the navigational system to the simulated location supplied by the test system.

The method of testing may further include, in embodiments, receiving an updated simulated location from the testing system and modifying the digital representation based on the updated simulated location. These steps may be repeated on a periodic basis to simulate the movement of an aircraft.

DETAILED DESCRIPTION

The disclosed system and method provide the ability to dynamically simulate the radio frequency environment encountered by an aircraft as if it were actually flying in a specific location. This allows the navigational equipment on an aircraft to be used in simulations in a manner that is representative of actual operation of the aircraft, unlike prior methods of simulation. The disclosed system requires a general purpose computer and commercially available RF-capable digital-to-analog converter cards such as the Pentek Model 78670 Digital/Analog Converter No specialized hardware is required to utilize the disclosed system.

When in flight and in the course of landing, aircraft rely on aids to navigation that utilize radio frequency signals to provide location information. These aids to navigation include, but are not limited to, Very High Frequency (VHF) Omni-directional Range Beacons (known as VOR), Instrument Landing System (ILS), Automatic Direction Finder (ADF) and Marker Beacon (MB). Typical aircraft are provided with at least one antenna to detect these varying signals and cabling to route the received signal to the appropriate radio frequency receiver for that function. So for example on a typical aircraft, a shared antenna for VOR and ILS is attached directly to the appropriate receiver units of the aircraft, while a separate antenna is provided for Glidescope signals which is connected to a separate receiver unit. In some situations, a single antenna or single receiver may be utilized to address multiple types of navigational aids. The disclosed system provides inputs to the various navigational receivers in the form of simulated signals as though they were detected by an actual antenna. The various navigational receivers and associated equipment for processing the radio signals from the navigational aids comprise the navigational system of the aircraft.

Figure 1:
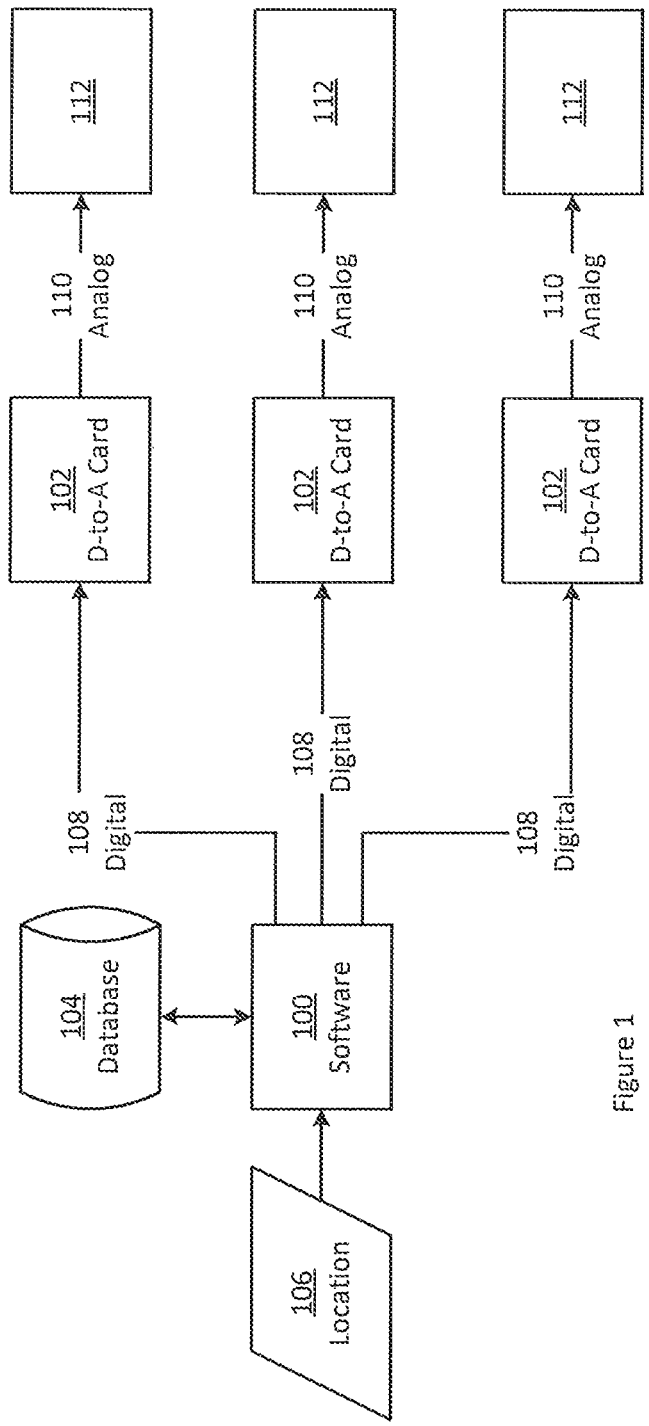
FIG. 1 is a schematic view of an embodiment of the radio frequency simulation system.

Referring now to FIG. 1, the system comprises software 100 executing on a general purpose computer, at least one digital to analog converter card 102 and a database 104 of navigational aids accessible to the software. The software 100 receives a simulated location 106 for an aircraft. The simulated location 106 may be provided by a flight simulation software or test system software in some embodiments. In some embodiments the simulated location 106 may comprise a general location in a known 3 axis coordinate system such as UPS coordinates and altitude values. In other embodiments the simulated location may comprise data specific to each navigational aid to be included in the simulated navigational signal, such as difference in depth of modulation for a specific ILS or bearing for a VOR beacon.

Based on the simulated location 106, the software 100 retrieves data from database 104 of the relevant navigational aids. The data retrieved from database 104 may comprise a list of one or more navigational aids and relevant data regarding each navigational aid. The database may be in the form of a relational database, flat files, data structures stored in memory, data available to the software 100 over a network or from various services available over the internet or other network.

The software 100 then calculates a digital representation 108 of a simulated radio frequency signal for at least one radio frequency band at the simulated location 106. Digital representation 108 is a digital numerical representation of the analog radio frequency waveform that is being simulated. The signal strength for a navigational aid may be estimated using predictive algorithms based on the location of the aircraft and the navigational aid, the speed of the aircraft and atmospheric variables. In embodiments, the resolution of the digital representation 108 is in the range of 16 bits to 128 bits, and in preferred embodiments is 64 bits. The value of the bits of information in the digital representation 108 change over time to produce the simulated radio frequency signal. In some embodiments, the software 100 updates the value that, comprises the simulated radio frequency signal at a rate that is between 20 Hz and 200 Hz, and in preferred embodiments is 80 Hz.

In some embodiments, the digital representation 108 of a simulated radio frequency signal for a given radio frequency band may be calculated as the combination of the signals of the various navigational aids in the database 104 that transmit in the desired radio frequency band. In some embodiments, they are combined based on the estimated signal strength of each navigational aid resulting from the characteristics of that navigational aid and its distance from the simulated position 106 of the aircraft. Multiple digital representations 108 may be simultaneously calculated by software 100 for different radio frequency bands or a single digital representation 108 may be calculated covering all desired radio frequency bands.

The digital representation 108 of a simulated radio frequency signal for each radio frequency band is then converted to a radio frequency signal output signal 110 by a digital to analog converter card 102. The converter card 102 must be of sufficiently high resolution and speed to convert the digital representation 108 to an analog signal without overly degrading the quality of the signal. The required resolution is discussed above with reference to the digital representation 108. The sampling rate of the digital to analog converter must also be sufficient to produce the required frequency signal without significant degradation.

The output 110 of the converter card 102 is then provided to the input of the appropriate receiver 112 for that radio frequency hand. The output 110 of each converter card may be combined into a single signal before providing them to the receiver 112. The receiver 112 processes the input signal as though it was received from an antenna, and when the receiver 112 decodes the input signal 110 it provides navigation information based on the simulated location 106, though the receiver is not operating in a test or simulation mode, nor has it been specially modified to receive simulated or test data.

The system may simultaneously create digital representations of simulated radio frequency signals for multiple radio frequency bands. The digital representations may be converted to analog radio frequency signals by a single or multiple digital to analog converters, and may be fed into all or more than one of the navigational aid receiver units.

The database 104 of navigational aids includes information regarding the location, frequency and type of each navigational aid. For example, the location of the navigational aid may be stored in the form of GPS coordinates or some other useful coordinate system. The type of navigational aid may include, without limitation, VOR, ILS, ADF, MB or other type of navigational aid. The database may also include information about other characteristics of the navigational aid, such as the transmission power of the navigational aid, morse code or human voice components of the transmission, radio frequency bands for transmission by the navigational aid, and other types of characteristic data.

In some embodiments, the digital representation 108 of the radio frequency signal may include signals for all desired radio frequency bands, as might occur on an aircraft with a single antenna. The combined signal is then converted to analog radio frequency signal 110 by digital-to-analog converters 102, and input to all the various navigational receivers which filter out any unwanted frequency bands per their normal operation.

Figure 2:
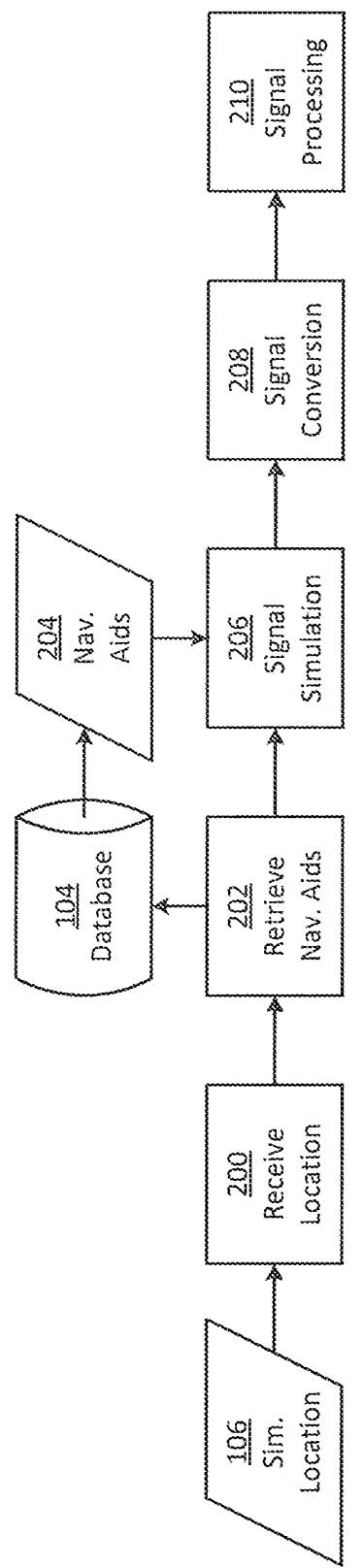
FIG. 2 is a schematic view of embodiment of the method of utilizing the radio frequency simulation system.

Referring now to FIG. 2, when using the system to simulate a radio frequency environment, the simulated position 106 of the aircraft in space is provided in step 200 to the system by the simulation or test environment. As described above, the simulated location 106 may be the location of the aircraft in a coordinate system such as GPS and an altitude. It may also incorporate other location data specific to a particular navigational aid. In some embodiments simulated location 106 may include bearings to VOR transmitters or distance and difference in depth modulation information for ILS systems, or other location data that is specific to certain navigational aids.

Upon receipt of the simulated position 106 of the aircraft, the system first accesses the characteristic data of each relevant navigational aid. The list of relevant navigational aids and characteristic data 204 is selected from the database 104 of navigational aids at step 202. In some embodiments, the criteria for selection may include the distance from the simulated position 106 of the aircraft to the navigational aid, the transmission strength of the navigational aid, the type of navigational aid, and other characteristics that may be appropriate for a simulation. In other embodiments, the database 104 may only contain data for navigational aids in a limited geographic area and all the data in database 104 may be selected for calculating the simulated radio frequency environment. The database 104 may be in any known manner of storing data for retrieval by software, including without limitation, lookup tables in memory or stored in files or a database capable of query via a query language of any type, and database 104 may be stored locally on the general purpose computer or accessible via a network.

Once the list of relevant navigational aids has been selected, the characteristic data of the navigational aid relevant to the simulated position 106 of the aircraft is determined. The type of characteristic data may be different for different types of navigational aids. For example, the bearing to and distance from a VOR station may be the relevant characteristic data for simulating the VOR transmission signal. Characteristic data for a VOR station may also include morse and voice components of the transmission. The bearing and distance may be provided as part of simulated location 106 or calculated by the software based on the simulated location 106 and the characteristic data from database 104. For an ILS navigational aid, the relevant characteristic data may include transmission frequencies, transmitter orientations, and the deviation of the aircraft from the desired glideslope or the runway centerline. The relevant data for ILS includes the difference in depth of modulation between the ILS signals. This difference in depth of modulation may be provided as part of simulated location 106 or calculated by the software based on the simulated location 106 and the data from database 104. In some embodiments, the simulated location 100 includes a signal strength indicator to determine the transmission strength of each navigational aid. For other types of navigational aids, the appropriate relationship may be different. The relevant relationship data is then utilized by software 100 to calculate the contribution of each navigational aid to the overall radio frequency environment.

For example, each VOR station generates a signal that includes a reference signal and a variable signal. The phase difference of these two signals is representative of the bearing to the VOR station in degrees from magnetic north (also called the "radial"), so the phase difference created in the simulated signal is calculated based on the bearing to the VOR station. That radial bearing may be provided as part of the simulated location 106 or calculated for that particular VOR station based on the simulated position of the aircraft and the known location of the VOR station. The VOR signal may also optionally include a morse code station identifier and a voice channel encoded in the reference signal. The digital representation of the VOR station signal contains a digital representation of the radio frequency signal that is created by the combined signals of the VOR station. As a result the analog signal created by the digital-to-analog signal conversion contains the data for all the components of the VOR signal, and the VOR receiver is able to decode the signal and interpret it as it would a real VOR signal.

For an ILS navigational aid, two reference radio signals are broadcast for glideslope and two for horizontal position in relation to the runway centerline. The difference in depth of modulation between the two signals for glideslope and the two for horizontal position indicate a deviation of the aircraft from the desired path. In the described invention, the simulated location 106 may include the deviation from the desired path for both glideslope and horizontal position. Alternatively, the simulated location 106 may be used to calculated the deviation from the desired path based on the known location of the ILS transmitters.

Other types of navigational aids may be simulated by the system described herein and will require other types of data be stored in database 104 and provided as part of simulated location 106.

At step 206, the software 100 generates the digital simulated signals 108 for each of the navigational aids that are relevant to the specific simulation. This process varies for the various types of navigational aids as described for some types above. The process may also be performed by software 100 on a single computer or multiple computers simultaneously. After signal simulation step 206, each signal 108 or the combination of all signals 108, is converted to an analog signal 110. At this step the signals 110 are simulations of the signals typically received by the navigational systems from the aircraft antenna. The navigational systems process the signals at step 210 as normal, allowing the users of the simulation environment to verify the operation of the navigational systems and their interoperability.

Given the nature of the simulated signals, radio frequency signals, steps 206 and 208 may be performed in parallel to provide a continuous output of analog radio frequency signal to the navigational system receiving the simulated signal. Step 206 continuously produces a digital representation of a radio frequency signal which is continuously and simultaneously converted into an analog signal 110 by digital to analog converter cards 102.

In some embodiments of the described invention, the simulated location 106 may be updated while the software 100 generates the digital signals 108. In such embodiments, the software may receive an updated location 106 and modify the continuously generated digital signals 108. In this manner the simulated location of the aircraft, as simulated by the radio frequency signals generated by the software 100, may change over time, simulating the movement of the aircraft.

Many different arrangements of the various components depicted, as well as components, not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

What is claimed is:

1. A method for simulating the radio frequency environment of an aircraft having a navigational system capable of receiving radio frequency signals for improved testing of the navigational system, the method comprising the steps of:
   providing a simulated location for the aircraft;
   selecting from a database a first navigational aid data descriptive of a first navigational aid;
   selecting from the database a second navigational aid data descriptive of a second navigational aid, the second navigational aid being of a different type than the first navigational aid;
   calculating a digital representation of a simulated radio frequency signal for each of the first navigational aid, and the second navigational aid, based on the simulated location, the first navigational aid data, and the second navigational aid data;
   combining the digital representations for each of the first navigational aid and the second navigational aid to create the digital representation of an entire simulated radio frequency signal;
   converting the digital representation of the entire simulated radio frequency signal to an analog radio frequency signal;
   providing the analog radio frequency signal into an in-service receiver in the navigational system of the aircraft avoiding a need for a direct connection being made into the navigation system;
   testing the navigation system of the aircraft while the receiver is in a mode of actual operation; and
   verifying interoperability of the navigation system and in-service receiver.

2. The method of claim 1 wherein the step of providing a simulated location for the aircraft comprises providing simulated location data for the aircraft for each of the first navigational aid and the second navigational aid.

3. The method of claim 1 wherein the step of converting the digital representation of a simulated radio frequency signal comprises the steps of:
   providing a plurality of digital-to-analog converters;
   providing each of the digital representations of a simulated radio frequency signal to a respective input channel of one of the plurality of digital-to-analog converters;
   receiving the analog radio frequency signal from an output channel of each of the plurality of digital-to-analog converters; and
   combining each of the analog radio frequency signals into a combined analog radio frequency signal.

4. The method of claim 3 wherein the step of providing the analog radio frequency signal to the navigational system of the aircraft comprises the steps of:
   providing the combined analog radio frequency signal to an antenna input of at least one receiver in the navigational system of the aircraft; and
   transmitting the combined analog radio frequency signal from the output channel to the antenna input of the at least one receiver.

5. The method of claim 4 further comprising the steps of:
   receiving an updated simulated location for the aircraft; and
   recalculating the digital representation of a simulated radio frequency signal using the updated simulated location.

6. The method of claim 5 wherein the step of calculating a digital representation of a simulated radio frequency signal, the step of converting the digital representation to an analog radio frequency signal and the step of providing the analog radio frequency signal to the navigational system are performed continuously and simultaneously.

7. The method of claim 1, wherein the first navigational aid comprises Very High Frequency (VHF) Omni-directional Range (VOR) Beacons and the second navigational aid comprises an Instrument Landing System (ILS).

8. The method of claim 4, further comprising:
   determining a location of the aircraft based on receiving the combined analog radio frequency signal; and
   testing the method for simulating the radio frequency environment of the aircraft by comparing the location of the aircraft with the simulated location for the aircraft.

9. A system for simulating the radio frequency environment of an aircraft having a navigational system capable of receiving radio frequency signals via an antenna input for improved testing of the navigational system, the system comprising:
   a simulated location for the aircraft;
   a first navigational aid data descriptive of a first navigational aid;
   a second navigational aid data descriptive of a second navigational aid, the second navigational aid being of a different type than the first navigational aid;
   software executable on a computer system, the software being configured to receive the simulated location, access the first and second navigational aid data, and calculate a digital representation of a combined simulated radio frequency signal for the first and second navigational aids based on the first and second navigational aid data and the simulated location;
   at least one digital-to-analog converter for receiving and converting the digital representation of the combined simulated radio frequency signal to an analog radio frequency signal on an output channel of the digital-to-analog converter; and
   a connection between the output channel of the digital-to-analog converter and the antenna input of the aircraft, wherein the antenna input of the aircraft receives the analog radio frequency signal and the navigation system determines a location of the aircraft for comparing with the simulated location of the aircraft, thus testing the navigational system of the aircraft without the need for a direct connection being made into the navigation system.

10. The system of claim 9 wherein the simulated location comprises simulated location data for the aircraft for each of a plurality of navigational aids.

11. The system of claim 9 wherein the software is capable of receiving an updated simulated location and modifying the digital representation and the analog radio frequency signal based on the updated simulated location.

12. The system of claim 11 wherein the digital-to-analog converter continuously receives and converts the digital representation of a simulated radio frequency signal to an analog radio frequency signal.

13. The system of claim 12 wherein the software continuously calculates a digital representation of a simulated radio frequency signal.

14. The system of claim 10 wherein the software is capable of simultaneously calculating a plurality of digital representations of for the respective plurality of navigational aids, combining the plurality of digital representations, and providing the combined digital representation to one of the at least one digital-to-analog converter.

15. A method for improved testing of the navigational system of an aircraft, the navigational system connected to at least one receiver for receiving radio frequency navigational signals, the method comprising the steps of:
providing a test system for simulating the location of the aircraft;
receiving from the test system a simulated location of the aircraft;
retrieving data regarding a plurality of navigational aids;
calculating a digital representation of a radio frequency signal based on the simulated location of the aircraft and the retrieved data by: (i) estimating a signal strength of each navigational aid based on characteristics of the navigational aid and its distance from the simulated position of the aircraft; and (ii) combining signals from a plurality of navigational aids that transmit in a desired radio frequency band based on an estimated signal strength of each navigational aid;
converting the digital representation into an analog radio frequency signal;
transmitting the analog radio frequency signal into existing aircraft equipment, the existing aircraft equipment including at least one receiver, the receiver feeding into the navigational system, the transmitting enabling verification of interoperability of the existing aircraft equipment and the navigation system in a test; and
comparing a location produced by the navigational system to the simulated location in the test.

16. The method of claim 15 further comprising the steps of:
receiving an updated simulated location;
modifying the digital representation based on the updated simulated location;
repeating the steps of receiving and modifying on a periodic basis to simulate the movement of the aircraft.

17. The method of claim 15 wherein the step of estimating a signal strength comprises using predictive algorithms based on the simulated location of the aircraft, the navigational aid data, a speed of the aircraft, and atmospheric variables.

18. The method of claim 15, further comprising enabling function of the navigational system to receive and process actual radio frequency signals, as expected in actual use, while being used in a simulation environment.

* * * * *